(12) United States Patent
Koschinsky et al.

(10) Patent No.: US 8,039,400 B2
(45) Date of Patent: Oct. 18, 2011

(54) REDUCING CONTAMINATION OF SEMICONDUCTOR SUBSTRATES DURING BEOL PROCESSING BY PERFORMING A DEPOSITION/ETCH CYCLE DURING BARRIER DEPOSITION

(75) Inventors: Frank Koschinsky, Radebeul (DE); Matthias Lehr, Dresden (DE); Holger Schuehrer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 75 days.

(21) Appl. No.: 12/418,857

(22) Filed: Apr. 6, 2009

(65) Prior Publication Data

US 2009/0325378 A1 Dec. 31, 2009

(30) Foreign Application Priority Data

Jun. 30, 2008 (DE) .......................... 10 2008 030 847

(51) Int. Cl.
*H01L 21/302* (2006.01)
(52) U.S. Cl. ...... 438/694; 438/734; 427/97.6; 427/99.2; 204/192.25; 204/192.35
(58) Field of Classification Search .................. None
See application file for complete search history.

(56) References Cited

U.S. PATENT DOCUMENTS

| | | | |
|---|---|---|---|
| 5,194,398 A * | 3/1993 | Miyachi et al. | 438/482 |
| 5,510,011 A * | 4/1996 | Okamura et al. | 204/192.3 |
| 6,121,111 A | 9/2000 | Jang et al. | 438/401 |
| 6,176,983 B1 * | 1/2001 | Bothra et al. | 204/192.17 |
| 6,758,947 B2 * | 7/2004 | Chiang et al. | 204/192.12 |
| 6,784,096 B2 | 8/2004 | Chen et al. | 438/637 |
| 2008/0003830 A1 * | 1/2008 | Qing et al. | 438/694 |

FOREIGN PATENT DOCUMENTS

EP 0 666 588 A2 8/1995
EP 1 670 051 A1 6/2006

OTHER PUBLICATIONS

Translation of Official Communication from German Patent Office for German Patent Application No. 10 2008 030 847.1 dated Apr. 14, 2009.

* cited by examiner

*Primary Examiner* — Anita Alanko
(74) *Attorney, Agent, or Firm* — Williams, Morgan & Amerson, P.C.

(57) ABSTRACT

A conductive barrier material of a metallization system of a semiconductor device may be formed on the basis of one or more deposition/etch cycles, thereby providing a reduced material thickness in the bevel region, while enhancing overall thickness uniformity in the active region of the semiconductor substrate. In some illustrative embodiments, two or more deposition/etch cycles may be used, thereby providing the possibility to select reduced target values for the barrier thickness in the die regions, while also obtaining a significantly reduced thickness in the bevel region.

25 Claims, 6 Drawing Sheets

REDUCING CONTAMINATION OF SEMICONDUCTOR SUBSTRATES DURING BEOL PROCESSING BY PERFORMING A DEPOSITION/ETCH CYCLE DURING BARRIER DEPOSITION

BACKGROUND OF THE INVENTION

1. Field of the Invention

Generally, the present disclosure relates to the fabrication of integrated circuits, and, more particularly, to the metallization layers and contaminations created during the manufacturing processes.

2. Description of the Related Art

Semiconductor devices are typically formed on substantially disc-shaped substrates made of any appropriate material. The majority of semiconductor devices, including highly complex electronic circuits, are currently, and in the foreseeable future will be, manufactured on the basis of silicon, thereby rendering silicon substrates and silicon-containing substrates, such as silicon-on-insulator (SOI) substrates, viable carriers for forming semiconductor devices, such as microprocessors, SRAMs, ASICs (application specific ICs) and the like. The individual integrated circuits are arranged in an array form, wherein most of the manufacturing steps, which may add up to 500-1000 and more individual process steps in sophisticated integrated circuits, are performed simultaneously for all chip areas on the substrate, except for photolithography processes, certain metrology processes and packaging of the individual devices after dicing the substrate. Thus, economical constraints drive semiconductor manufacturers to steadily increase the substrate dimensions, thereby also increasing the area available for producing actual semiconductor devices.

In addition to increasing the substrate area, it is also important to optimize the utilization of the substrate area for a given substrate size so as to actually use as much substrate area as possible for semiconductor devices and/or test structures that may be used for process control. In the attempt to maximize the useful surface area for a given substrate size, the peripheral die regions are positioned as closely to the substrate perimeter as it is compatible with substrate handling processes. Generally, most of the manufacturing processes are performed in an automated manner, wherein the substrate handling is performed at the backside of the substrate and/or the substrate edge, which typically includes a bevel, at least at the front side of the substrate.

Due to the ongoing demand for shrinking the feature sizes of highly sophisticated semiconductor devices, copper and alloys thereof, in combination with a low-k dielectric material, have become a frequently used alternative in the formation of so-called metallization layers, which include metal lines and vias connecting individual circuit elements to provide the required functionality of the integrated circuit. Although copper exhibits significant advantages when compared to aluminum, being the typical metallization metal for the last decade, semiconductor manufacturers have been somewhat reluctant to introduce copper in the production owing to copper's ability to readily diffuse in silicon and silicon dioxide. Moreover, even when being present in very small amounts, copper may significantly modify the electrical characteristics of silicon and, thus, the behavior of circuit elements, such as transistors and the like. It is, therefore, essential to confine the copper to the metal lines and vias by using appropriate insulating and conductive barrier layers to strongly suppress the diffusion of copper into sensitive device regions. Furthermore, any contamination of process tools, such as transport means, transport containers, robot arms, wafer chucks and the like, must be effectively restricted, since even minute amounts of copper deposited on the backside of a substrate may lead to diffusion of the copper into sensitive device areas.

The problem of copper and other device and tool contamination is even exacerbated when low-k dielectric materials are employed in combination with copper to form metallization layers owing to the reduced mechanical stability of the low-k dielectrics. Since at least some of the deposition processes used in fabricating semiconductors may not be efficiently restricted to the "active" substrate area, a stack of layers or material residues may also be formed at the substrate edge region including the bevel, thereby generating a mechanically unstable layer stack owing to process non-uniformities at the substrate edge and especially at the bevel of the substrate. In particular, low-k dielectrics formed by chemical vapor deposition (CVD) tend to adhere more intensively at the bevel edge region compared to the active substrate region, thereby building up an increased layer thickness. Thus, during the formation of a plurality of metallization layers, a layer stack at the bevel region may be formed that includes barrier material, copper and dielectrics, which exhibit a reduced adhesion to each other. During the further production and substrate handling processes, material such as copper, barrier material and/or the dielectrics may delaminate and significantly affect these processes, thereby negatively affecting production yield and tool integrity.

For instance, in forming a copper-based metallization layer, the so-called inlaid or damascene technique is presently a preferred manufacturing method to create metal lines and vias. To this end, a dielectric layer, typically comprised of a low-k dielectric, is deposited and patterned so as to receive trenches and vias in accordance with design requirements. During the patterning process, polymer materials, which may be used for adjusting the etch characteristics of the patterning process, may be deposited on substrate areas of highly non-uniform process conditions, such as the substrate edge, the bevel and the adjacent backside area. The polymer materials, which include fluorine, may additionally contribute to modified adhesion properties for any other material that may be deposited in subsequent processes, thereby contributing to an increased tendency for causing delamination events. Therefore, in some approaches a respective wet chemical clean process may be performed in an attempt to remove the polymer residuals. Thereafter, a conductive barrier layer comprised of, for example tantalum, tantalum nitride, titanium, titanium nitride, and the like, may be deposited, wherein the composition of the barrier layer is selected so as to also improve the adhesion of the copper to the neighboring dielectric. The deposition of the barrier layer may be accomplished by chemical vapor deposition (CVD) or physical vapor deposition (PVD), wherein a deposition of the barrier material may not be efficiently restricted to the active substrate area by presently established deposition techniques. Consequently, the barrier material may also be deposited at the substrate bevel and partially at the backside of the substrate, thereby forming, in combination with residues of the dielectric material that may not be efficiently removed by the previous etch processes for patterning the dielectric layer, a layer stack of reduced mechanical stability, wherein any polymer residuals that may not have been removed efficiently, due to a limited efficiency of the previous wet clean process, may additionally reduce the mechanical stability. Thereafter, according to a standard damascene process flow, a thin copper seed layer is deposited by physical vapor deposition or similar appropriate processes to initiate and promote a subsequent electrochemical deposition process to fill the trenches and vias formed in the dielectric material.

Although reactor vessels for the electrochemical deposition, such as electroplating reactors or electroless plating reactors, may be designed such that substantially no copper is deposited at the substrate edge, the preceding seed layer deposition process may nevertheless result in a significant deposition of unwanted copper at the substrate edge region. After the electrochemical deposition of the bulk copper, any excess material has to be removed. This is frequently achieved by chemical mechanical polishing (CMP), wherein material fragments, such as tantalum-containing copper pieces, may "flake off" owing to the reduced stability of the metallization layer stack, especially at the substrate bevel. The tantalum-containing material flakes and other material flakes comprised of dielectric material and/or metal material, for instance liberated during the CMP process, may then redeposit at unwanted substrate regions or may affect the CMP process of subsequent substrates. During the further processing of the substrate, a contamination, mainly caused by the delamination at the substrate edge, may contribute significantly to yield loss at a very advanced manufacturing stage.

Since contamination caused by, for instance, tantalum-based flakes has been identified as a major contamination source, great efforts are being made to reduce material delamination at the substrate edge and the bevel substantially without affecting the inner, i.e., the active, substrate region. To this end, etch modules have been developed by semiconductor equipment providers which are configured to selectively provide an agent substantially comprised of sulfuric acid and hydrogen peroxide to the substrate edge to remove unwanted material from this region, which, however, also contributes to yield loss due to the complex etch regime. In other cases, a deposition mask in the form of a ring is provided during the deposition of the barrier material, which is considered as the main contributor in view of yield loss. The deposition ring, however, may also shadow the die regions in the vicinity of the substrate edge, thereby reducing control of the final barrier thickness in these substrate areas, which require increased margins for the barrier thickness. Thus, in addition to increased product variability, reduced performance may be also obtained due to the generally increased barrier thickness.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques that enable a significant reduction of yield loss during the formation of metallization layers of semiconductor devices, in which efficient conductive barrier materials may have to be provided, for instance, possibly in combination with sophisticated dielectric layer stacks, which may result in conventional strategies in increased yield loss or reduced uniformity of product characteristics caused by material delamination and corresponding selective deposition techniques, respectively. For this purpose, the probability for material delamination or "flaking" during the patterning of metallization layers may be reduced by appropriately reducing a layer thickness of a conductive barrier material in the bevel region without using additional external mask elements, such as deposition rings, while also avoiding complex selective etch processes. According to illustrative aspects disclosed herein, a "selective" material removal or a spatially selective reduced layer thickness of the conductive barrier material may be obtained on the basis of a process sequence including at least one deposition step for forming a conductive barrier material followed by an etch process for removing a portion of the conductive barrier material, thereby causing an increased material removal at the bevel region, which may thus result in a desired reduced amount of conductive barrier material, thereby reducing the probability of creating contaminants during the further processing of the device. In illustrated aspects disclosed herein, a corresponding deposition/etch cycle may be performed at least twice, thereby sequentially improving overall uniformity of the conductive barrier material while nevertheless further reducing the layer thickness at the bevel region. The enhanced uniformity of the resulting conductive barrier layer may provide the basis for selecting a reduced target value for the conductive barrier material within the central region of a substrate, thereby enhancing device performance, due to increased conductivity of metal lines and vias formed in the metallization system of the semiconductor device, while, additionally, a reduced target value for the central region may further enhance the desired reduced thickness at the bevel region, since generally a reduced amount of barrier material may have to be deposited during the deposition/etch cycles.

One illustrative method disclosed herein comprises selecting a first target value and a second target value for a thickness of a conductive barrier layer to be formed on a substrate, wherein the substrate has a bevel region and a central region including a plurality of die regions. The first target value is less than the second target value and corresponds to the bevel region, wherein the second target value corresponds to the central region. Furthermore, the method comprises performing a process sequence comprising at least one deposition/etch cycle for depositing material of the conductive barrier layer above the substrate and subsequently removing material of the conductive barrier layer so as to adjust a thickness of the conductive barrier layer at or below the first and second target values.

A further illustrative method disclosed herein comprises forming a dielectric layer stack for a metallization layer of a semiconductor device above a substrate, wherein the substrate comprises a central region adjacent to a bevel region. Additionally, the method comprises performing a plurality of deposition/etch cycles to form a conductive barrier layer above the dielectric layer stack.

A still further illustrative method disclosed herein relates to forming a metallization layer of a semiconductor device. The method comprises depositing a first sub-layer of a conductive barrier material above a patterned dielectric layer and a beveled region of a substrate. Moreover, a portion of the first sub-layer is removed and a second sub-layer of the conductive barrier material is deposited on the first sub-layer. Finally, a portion of the second sub-layer is removed.

BRIEF DESCRIPTION OF THE DRAWINGS

The disclosure may be understood by reference to the following description taken in conjunction with the accompanying drawings, in which like reference numerals identify like elements, and in which.

Figure 1A:
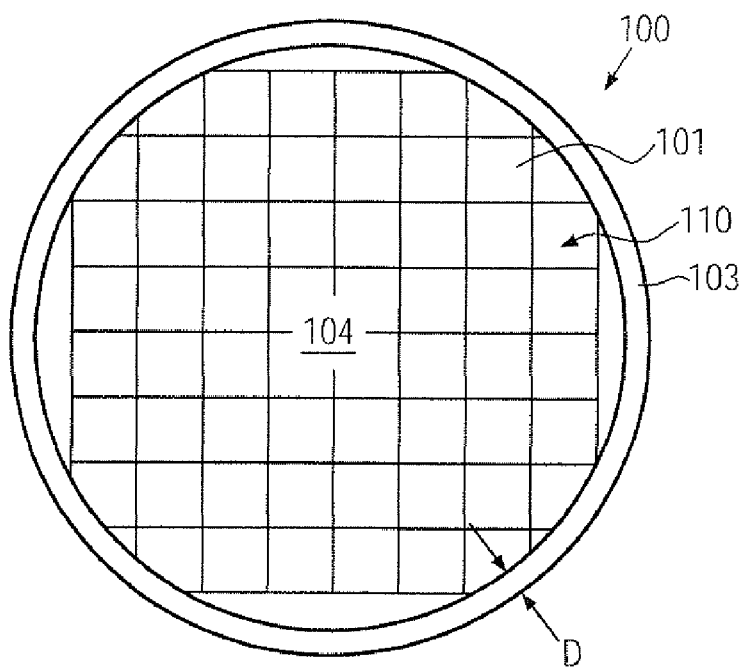
FIG. 1a schematically illustrates a top view of a substrate including a central region accommodating a plurality of die regions and a bevel region.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to a technique that provides enhanced production yield and/or increased uniformity of product performance by significantly reducing the thickness of a conductive barrier material layer within the bevel region of the substrate during the manufacturing sequence for forming sophisticated metallization systems of semiconductor devices. As previously explained, experimental observations indicate that significant yield losses may be associated with the presence of conductive barrier material, such as tantalum, in the bevel regions of the substrates. Thus, conventional measures for reducing the amount of tantalum material in the bevel region are directed to concepts in which material accumulation during the deposition of the barrier layer may be reduced at the bevel region by using deposition masks, which, however, may result in reduced controllability of the layer thickness at die regions located in the vicinity of the bevel region. Contrary to these conventional approaches, it has been recognized by the inventors that a non-masked process sequence may be used which may provide an efficient material redistribution in the central region, while resulting in a significant material reduction selectively at the bevel region. Consequently, respective external masking elements as well as substrate internal mask layers and the like may not be required, thereby enhancing overall process efficiency. At the same time, enhanced material uniformity and step coverage may be accomplished in the actual die regions, thereby enabling the selection of a reduced target value for the conductive barrier material, which in turn may result in enhanced overall device performance, since, for instance, for given design dimensions of respective metal regions, such as metal lines and vias, the amount of conductive barrier material which may exhibit a significantly reduced conductivity compared to metals such as copper may be reduced within the metal features for the benefit of increasing the fraction of highly conductive metal, thereby contributing to overall device performance without degrading the diffusion blocking capabilities of the conductive barrier material.

Without intending to restrict the present disclosure to the following explanation, it is believed that, after the deposition of a conductive barrier material, a subsequent etch process, such as a sputter etch process in which basically atoms may be liberated from the previously deposited barrier material, may become volatile to a more or less degree. Depending on the overall process parameters during the etch step, for instance with respect to temperature and pressure, a certain degree of re-deposition may occur, wherein, in the central region of the substrate, the redistribution of the material may result in enhanced step coverage and thickness uniformity. At the edge of the substrate, however, the degree of redistribution may be reduced since the bevel region may not have a "neighboring" area in which also increasingly material of the conductive barrier layer may be released into the environment. Consequently, the probability of a re-deposition of a previously released atom may be significantly less compared to the central region, thereby resulting in a continuously decreasing layer thickness at the bevel region. In some illustrative embodiments disclosed herein, two or more deposition/etch cycles may be performed, wherein each deposition step may provide a moderately thin layer thickness, which may be made more uniform in the central region during the subsequent etch step, while a cumulative reduction of layer thickness may be accomplished in the bevel region.

FIG. 1a schematically depicts a substrate 100 having a front side 101 on which a plurality of die regions 110 may be formed, each of which may represent a semiconductor device having formed therein circuit elements, such as transistors and the like. Furthermore, the substrate 100 may comprise a back side, which is frequently in contact with any type of substrate holders during the transport and processing of the substrate 100. The front side 101 of the substrate 100 may comprise an active or central region 104, that is, the central region 104 may represent the plurality of die regions 110, while an edge or bevel region 103 may not be used for the fabrication of circuit elements due to process non-uniformities, substrate handling requirements and the like, wherein deposition non-uniformities may occur within the bevel region 103, as previously explained. The size of the bevel region 103 and thus of the central region 104 depends on the controllability of the processes involved in manufacturing circuit elements in and on the central region 104, the capability of transport systems used for supporting and transporting the substrate 100 between subsequent processes and the like. In view of a maximum area utilization of the substrate 100, the size of the bevel region 103 may be kept as small as possible to preserve as much substrate area as possible for the die regions 110. Presently 200 mm and 300 mm are typical diameters of the substrates used in modern semiconductor facilities, wherein a width D of the bevel region 103 may range from approximately 1-5 mm. Thus, according to illustrative embodiments disclosed herein, the process of forming a conductive barrier material within the die regions 110 and the bevel region 103 may be controlled such that a desired layer thickness according to a predefined target value may be obtained within the die regions 110 with enhanced uniformity across the entire central region 104, irrespective of whether a central die or a die region in the vicinity of the bevel region 103 is considered. On the other hand, a respective target value in the bevel region 103 may be set to a moderately low value in order to reduce the probability of creating barrier-induced contaminations during the further processing of the substrate 100.

Figure 1B:
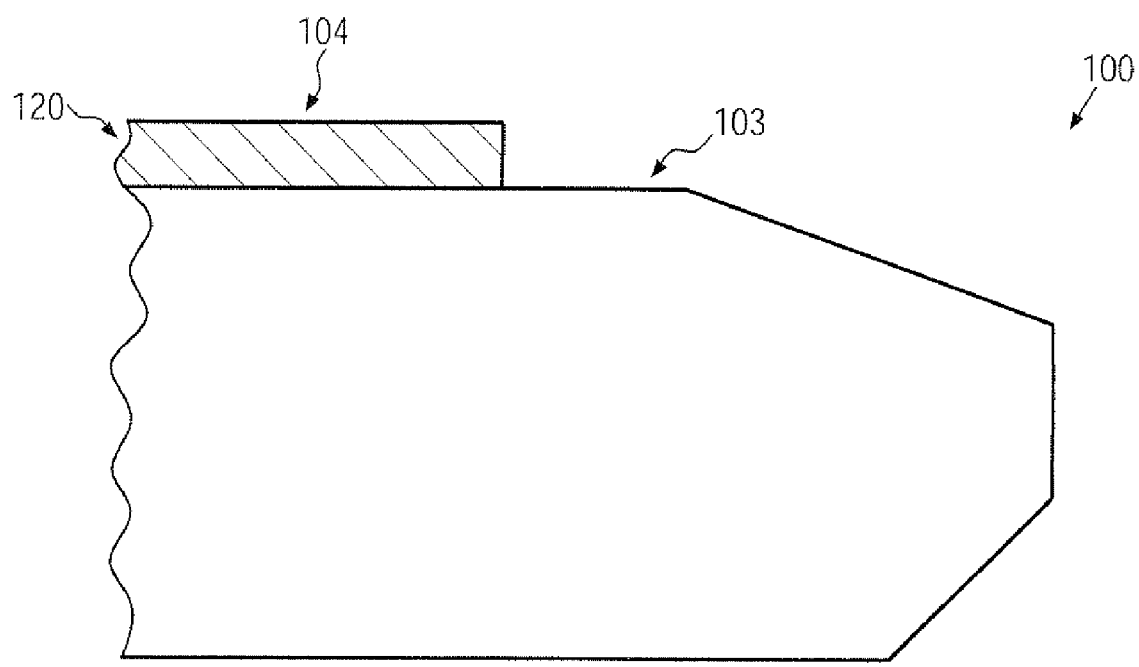
FIGS. 1b-1f schematically illustrate cross-sectional views of a semiconductor device during various manufacturing stages in forming a metallization layer, wherein a reduced thickness of a conductive barrier material may be obtained at the bevel region by alternatingly performing a deposition step and an etch step so as to preferably remove material at the bevel region, according to illustrative embodiments.

FIG. 1*b* schematically illustrates a cross-sectional view of the substrate 100 according to a specified manufacturing stage. As illustrated, a dielectric layer stack 120, which may comprise one or more different dielectric materials, such as silicon dioxide, silicon nitride, silicon carbide and the like, possibly in combination with low-k dielectric materials and the like, may be formed in and above the central region 104, wherein the layer stack 120 may be formed in a more or less pronounced state in the bevel region 103. For convenience, the bevel region 103 is shown so as to be substantially free of a dielectric material of the stack 120, while in other cases more or less amounts of dielectric material may also be provided in the region 103, depending on the overall process strategy. For example, spatially selective etch processes may be used so as to remove unwanted dielectric material from the bevel region 103. It should further be appreciated that the cross-sectional view of FIG. 1*b* is not to scale, since typically a thickness of the substrate 100 may be in the range of several hundred micrometers, while a thickness of the dielectric layer 120 may be in the range of several micrometers or less. In some illustrative embodiments, the dielectric layer or layer stack 120 may represent the dielectric material of a metallization layer of a semiconductor device to be formed in each of the die regions 110 (FIG. 1*a*). To this end, well-established manufacturing techniques may be used, which may comprise the deposition of any appropriate dielectric material on the basis of chemical vapor deposition (CVD), spin-on techniques and the like. Thereafter, any appropriate etch masks may be formed, for instance on the basis of well-established photolithography techniques, in order to pattern the layer 120, as will be described later on in more detail.

Figure 1C:
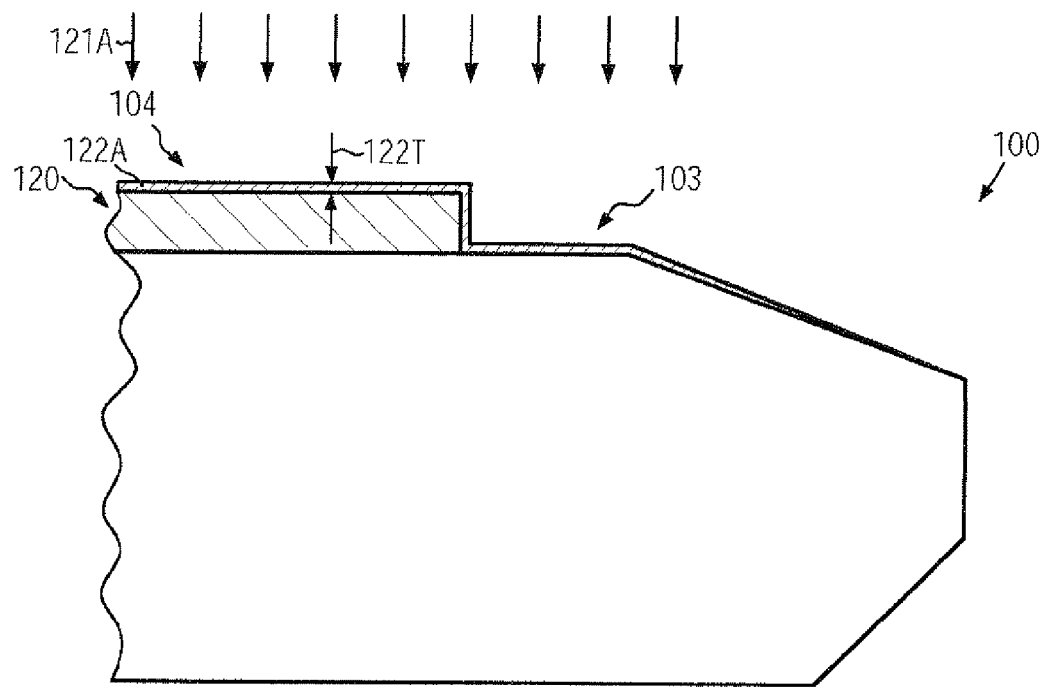

FIG. 1*c* schematically illustrates the substrate 100 in a further advanced manufacturing stage. As illustrated, the substrate 100 is exposed to a deposition ambient 121A, which, in one illustrative embodiment, may be established in the form of a physical vapor deposition recipe, or such as sputter deposition, in which typically a plasma ambient may be used to create a particle bombardment in the vicinity of a target material which may include at least one component that has to be deposited on exposed surface areas of the substrate 100. Thus, during the particle bombardment, atoms may be released from the target material and may represent volatile components in the deposition ambient 121A, which may finally come into contact with exposed surface areas of the substrate 100 so as to adhere thereon, thereby increasingly forming a layer 122A. In some cases, a high degree of directionality may be achieved during the deposition 121A by establishing a bias voltage in which ionized target atoms may be directed to the deposition surface together with non-ionized particles. The degree of directionality as well as deposition rate and material composition that may finally be deposited as the layer 122A may be adjusted on the basis of process parameters, such as surface temperature, pressure, presence of precursor materials and the like. For example, in well-established deposition recipes, tantalum may be deposited, possibly in combination with a nitrogen material, thereby forming a tantalum nitride layer on the deposition surface. In this case, the nitrogen material may be provided in the form of a precursor gas that may be added to the ambient 121A, while, in other cases, the nitrogen material may be incorporated in a corresponding target material, from which the nitrogen atoms may be sputtered off. Since tantalum and tantalum nitride may represent well-established barrier materials in combination with copper, in one illustrative embodiment, the layer 122A, which may represent a sub-layer or a preliminary layer of a conductive barrier material, may comprise tantalum, while in other cases the layer 122A may be comprised of tantalum nitride. It should be appreciated, however, that, in other illustrative embodiments, any other appropriate conductive barrier material may be deposited, for instance in the form of titanium, titanium nitride, cobalt in combination with other components such as tungsten and the like. In some illustrative embodiments, a target value for a thickness of the layer 122A in the bevel region 103 is selected to be small, in which actually a deposition of the layer 122A may not be desirable, while a corresponding target value may be selected for the central region 104 in view of the required electrical performance of respective metal features to be formed in the dielectric layer 120. For example, in one illustrative embodiment, the deposition process 121A may be performed such that a thickness 122T in the central region 104, which may be understood as an average thickness due to a typical thickness variation across the central region 104 of approximately 5-10 percent, may be higher than the preselected target value for the central region 104.

Figure 1D:
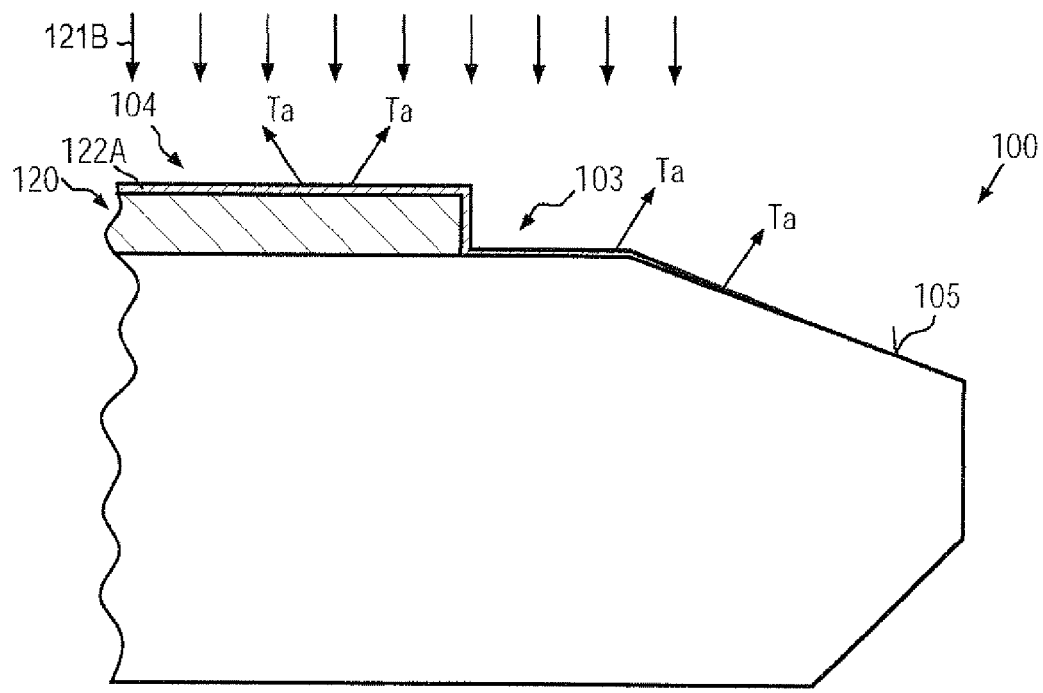

FIG. 1*d* schematically illustrates the substrate 100 in a further advanced manufacturing stage. As illustrated, the substrate 100 is exposed to an etch ambient 121B that is appropriate for removing material of the layer 122A, preferably on the basis of a substantially physical interaction with the layer 122A. That is, during the etch step 121B, which in one illustrative embodiment may be established within the same process chamber as the previously performed deposition step 121A, a more or less pronounced bombardment of the layer 122A may be established so as to increasingly sputter off atoms from the layer 122A. A corresponding mechanism in which material removal may be caused by particle bombardment without significant chemical interaction may be referred to as sputter etching and may be considered as a similar process as may be used for enriching a sputter deposition ambient with the required deposition species by sputtering off the species from a specified target material. During the etch step 121B, the "target" material may be represented by the initially deposited layer 122A. By appropriately selecting process parameters, such as temperature, pressure, plasma power for creating the particle bombardment and the like, which may be accomplished on the basis of well-established process techniques, the actual removal rate may be adjusted. For example, by establishing a moderate substrate temperature in combination with a moderately high process pressure, the material liberated from the layer 122A may be maintained in the vicinity of the substrate 100 or may be ionized and redirected to the surface of the substrate 100, thereby creating a certain degree of redistribution of the previously removed material. On the other hand, in the bevel region 103 and at a bevel 105, generally the presence of material removed from the layer 122A may be reduced, since respective material may be applied from one side, while from the periphery of the substrate 100 the corresponding enrichment of the etch ambient 121B with material of the layer 122A may be significantly reduced. Consequently, during the etch step 121B, a moderately low overall removal may take place in the central region 104 while nevertheless providing a desired redistribution and thus enhanced thickness uniformity in the central region 104, while efficiently reducing the thickness in the bevel region 103. Thus, in some illustrative embodiments, the etch step 121B may be performed so as to obtain the desired target value in the central region 104 while additionally improving overall thickness uniformity, while obtaining a significantly reduced thickness in the bevel region 103.

Figure 1E:
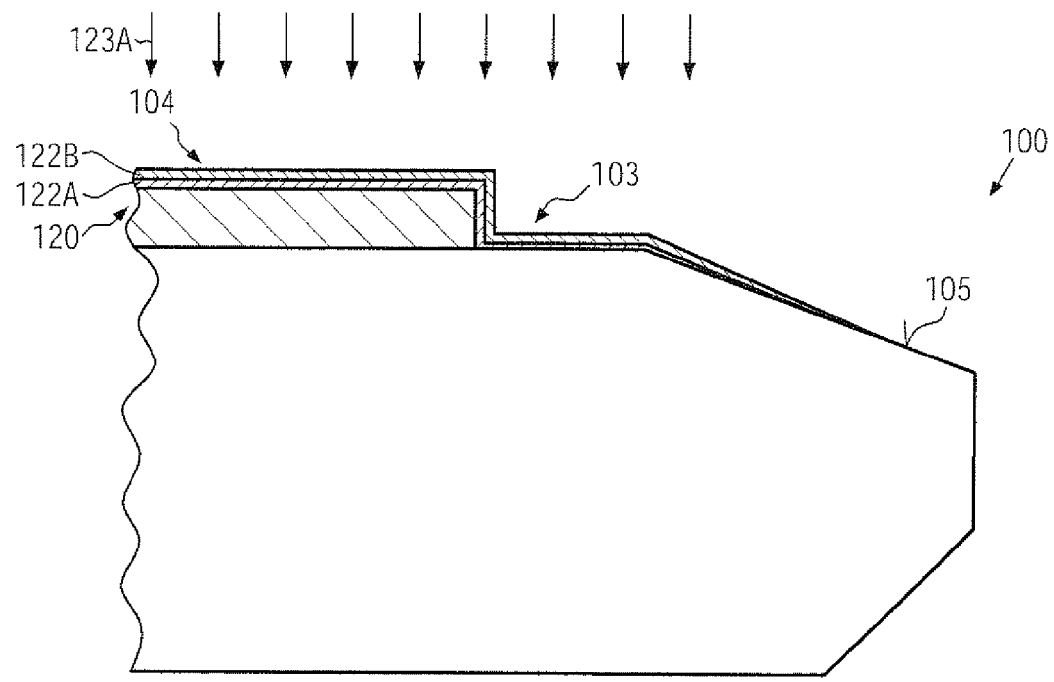

FIG. 1e schematically illustrates the substrate 100 according to further illustrative embodiments. As illustrated, the substrate 100 is exposed to a further deposition step 123A, thereby forming a further sub-layer 122B of a conductive barrier material. In some illustrative embodiments, the deposition step 123A may be performed on the basis of substantially the same process parameters as the deposition process 121A, when the same type of material is to be provided in the sub-layer 122B. That is, a desired conductive barrier material or a portion thereof, such as tantalum nitride, tantalum and the like, may be formed in sequential deposition steps, each of which may provide a desired reduced layer thickness, wherein a corresponding intermediate etch step may provide enhanced thickness uniformity, while additionally removing material at the bevel region 103 with increased removal rate. In still other illustrative embodiments, the deposition process 123A may be performed on the basis of a different material, for instance a precursor material may be supplied or the supply thereof may be discontinued, depending on the overall requirements. For example, if the sub-layer 122A may comprise tantalum nitride and the layer 122B may be comprised of tantalum, the supply of a nitrogen-containing precursor material may be discontinued during the deposition process 123A.

Figure 1F:
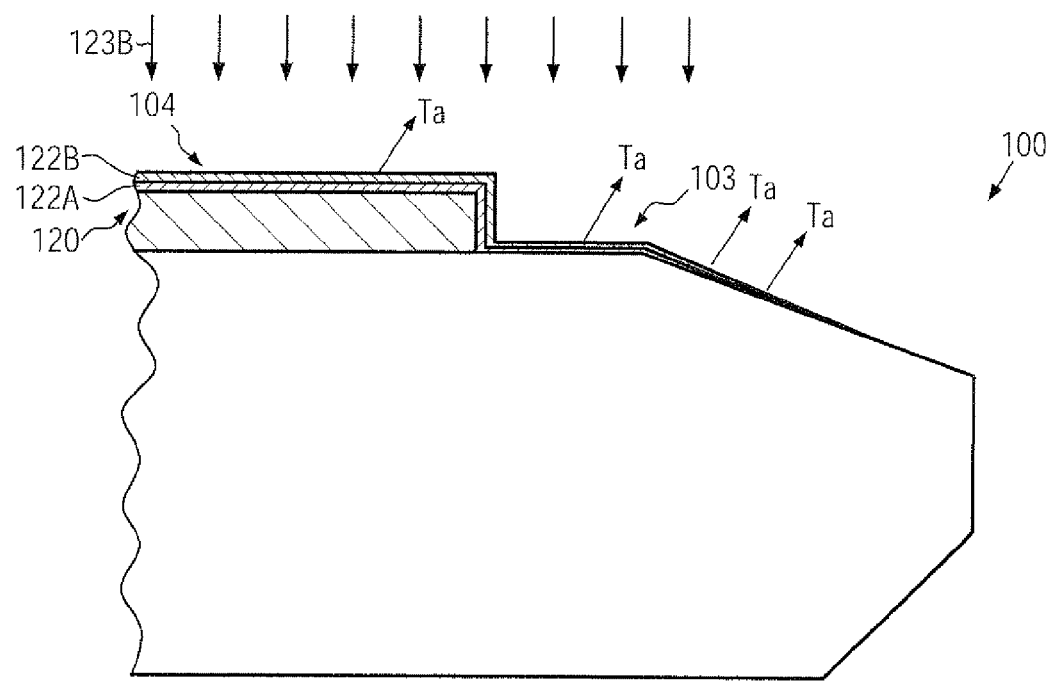

FIG. 1f schematically illustrates the substrate 100 during a further etch process 123B that may, in one illustrative embodiment, be performed in the same process chamber as the deposition step 123A. Similarly, as described above, the etch process 123B may be designed to liberate material from the previously deposited layer 122B thereby providing a desired degree of material redistribution in the central region 104, while providing an enhanced removal rate in the bevel region 103. Consequently, as in the previously performed deposition/etch cycle comprising the steps 121A, 121B, also in this deposition/etch cycle comprising the processes 123A, 123B, enhanced layer uniformity may be obtained in the region 104, while preferably removing material from the bevel region 103. In one illustrative embodiment, the deposition/etch cycles 121A, 121B and 123A, 123B may be combined to generate an increasing layer thickness in the central region 104, while continuously reducing the thickness in the bevel region 103. In this case, the net removal rate obtained by the corresponding etch steps 121A, 123B may be lower in the central region 104 compared to the net deposition rate obtained by the deposition steps 121B, 123A. Contrary thereto, the overall removal rate in the bevel region 103 may be significantly higher compared to the overall deposition rate, thereby continuously decreasing the overall layer thickness. In other illustrative embodiments, the process parameters during the cycles 121A, 121B and 123A, 123B may be selected such that, after the deposition of the layer 122A in combination with the removal process 121B, and after the deposition of the sub-layer 122B and the process 123B, the layer thickness in the central region 104 may be less compared to the initial layer thickness 122T (FIG. 1c), which may, for instance, be accomplished by providing the layer 122A with an increased thickness compared to the target value, removing a portion thereof and depositing the layer 122B with an appropriate thickness so that, after the further etch process 123B, in total, a reduced thickness compared to the initial thickness 122T may be obtained, which may correspond to the desired target value for the central region 104. On the other hand, in the bevel region 103, an efficient reduction of the initially deposited layer thickness 122A may be obtained, due to the mechanisms as described above.

It should be appreciated that, in other illustrative embodiments, one or more additional deposition/etch cycles may be added in order to further enhance overall thickness uniformity in the central region 104, while further reducing any unwanted material in the bevel region 103. In this case, a third sub-layer (not shown) may be deposited which may have the same material composition as one or both of the previously deposited layers 122A, 122B or which may have a different material composition. For example, the layers 122A, 122B may be deposited in the form of a tantalum nitride material wherein, possibly the final thickness thereof, i.e., the combination of the sub-layers 122A, 122B, may be less compared to the initial thickness 122T, while subsequently a further deposition/etch cycle may provide a tantalum material with enhanced uniformity while nevertheless reducing the amount of tantalum in the bevel region 103. In other cases, a first material composition may be formed on the basis of the cycle 121A, 121B and thereafter a different material composition may be deposited on the basis of the cycle 123A, 123B and a further deposition/etch cycle. In still other illustrative embodiments, two or more deposition/etch cycles may be used for providing a single material composition, after which one or more further deposition/etch cycles may follow to form a further material composition, depending on the overall requirements. It should be appreciated that more than two different material compositions may also be provided on the basis of a respective sequence of deposition/etch cycles.

Figure 1G:
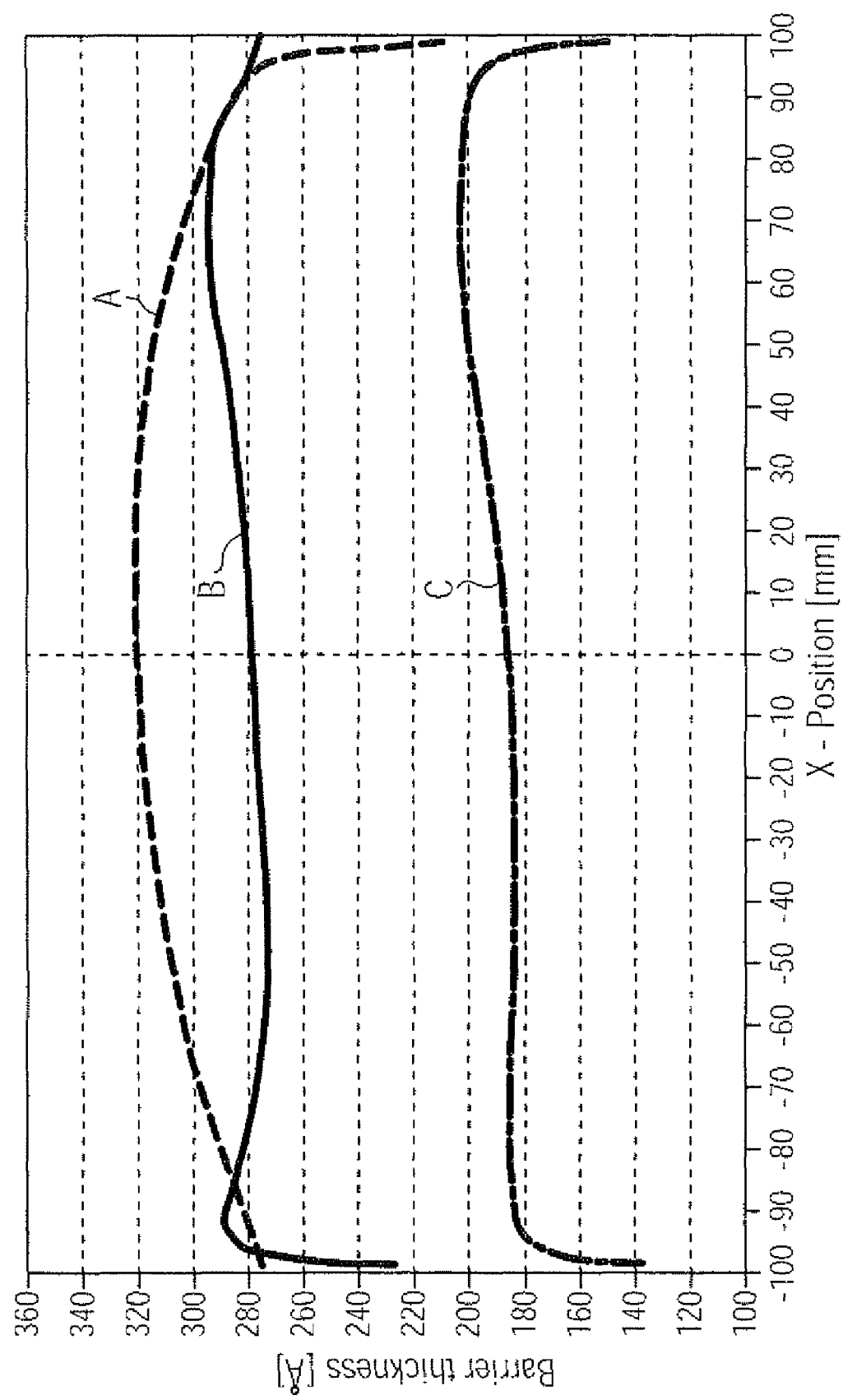
FIGS. 1g-1h schematically illustrate the thickness of a conductive barrier material across a substrate and in the vicinity of the bevel region, respectively, obtained by using a plurality of deposition/etch cycles, according to illustrative embodiments.

FIG. 1g schematically illustrates thickness values of a conductive barrier material 122, which may comprise at least one of the sub-layers 122A, 122B, possibly in combination with one or more additional sub-layers (not shown). For example, in FIG. 1g, curve A may represent the thickness values across the substrate 100 after the deposition process 121A in order to form the layer 122A. As illustrated, in this case, a pronounced thickness variation may be observed while also a moderately high thickness of the conductive barrier material may be provided at the substrate edge, that is, in the bevel region 103. Curve B may represent the distribution of the layer thickness according to one deposition/etch cycle, such as the processes 121A, 121B, thereby providing efficient material redistribution, which may finally result in a significantly reduced thickness at the bevel region 103. Curve C may represent the distribution of a conductive barrier material 122 in accordance with further illustrative embodiments, in which at least two deposition/etch cycles may be used, wherein also a reduced final thickness may be obtained in the central region 104, while also a reduced thickness may be obtained in the bevel region 103. As previously indicated, due to the enhanced overall thickness uniformity, the reduced target value may be selected for the central region 104, thereby enhancing overall device performance while not contributing to reduced production yield.

Figure 1H:
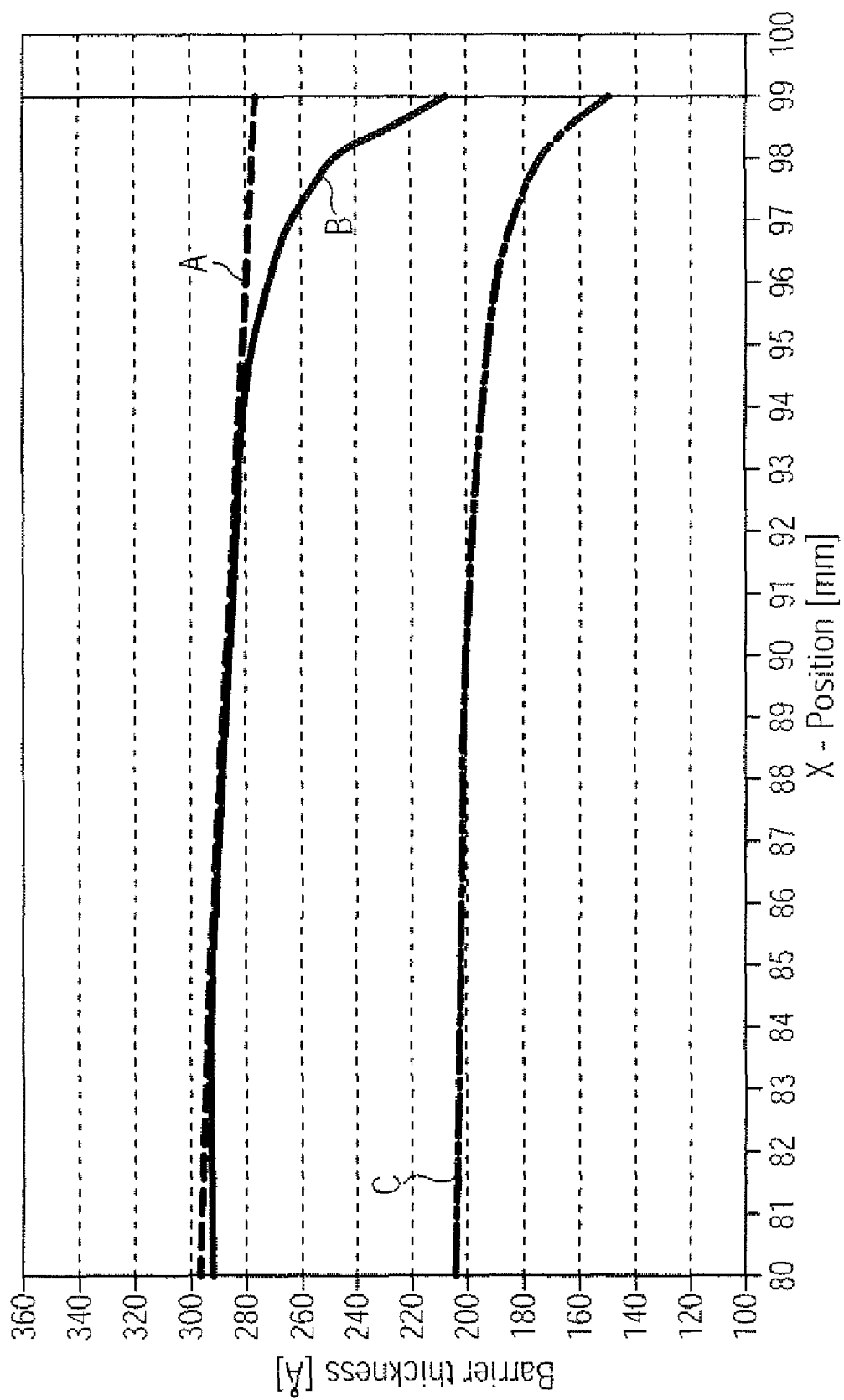

FIG. 1h schematically illustrates the thickness distributions of FIG. 1g with higher resolution with respect to the bevel region 103.

As illustrated in FIGS. 1g and 1h, the target value of less than 30 nm may be used for the conductive barrier layer 122 in the central region 104, thereby obtaining a thickness of approximately 22 nm and less in the bevel region 103. Consequently, the effective layer thickness at the actual bevel 105 may be even further reduced, thereby significantly reducing any probability of producing contaminants during the further processing due to barrier delamination and the like, as previously explained. In some illustrative embodiments, a target thickness of approximately 21 nm may be selected for the central region 104 with a variation of approximately 10 percent, while a thickness of 16 nm and less may be obtained in the bevel region.

Figure 1I:
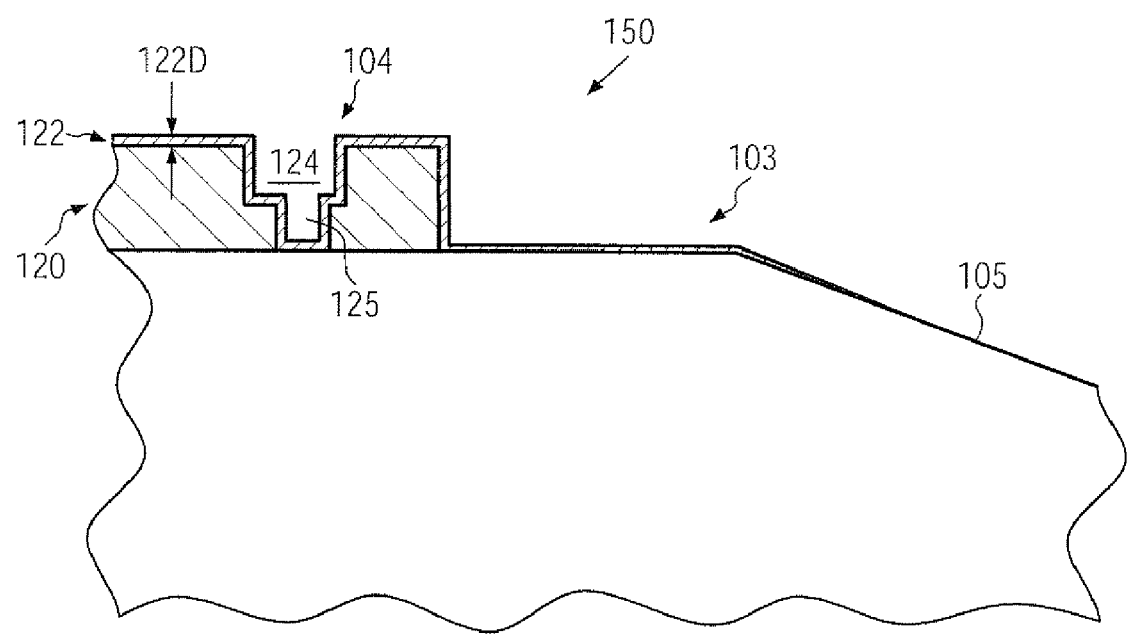
FIG. 1i schematically illustrates a cross-sectional view of a metallization layer of a die region located in the vicinity of the bevel region, wherein a reduced thickness of the die region may be used, due to increased overall thickness uniformity accomplished by the deposition/etch cycles provided in accordance with further illustrative embodiments.

FIG. 1i schematically illustrates a semiconductor device 150 that may be formed above the substrate 100. As illustrated, in the central region 104, for instance in a die region located in the vicinity of the bevel region 103, the metallization layer 120 may be patterned so as to include a trench 124 in combination with a via 125, which may have lateral dimensions in accordance with the overall design rules of the device 150. For example, the via 125 may have a lateral dimension of several hundred nanometers or significantly less, such as 100 nm and less for sophisticated semiconductor devices including circuit elements such as transistors and the like having a critical dimension of 100 nm and less. Similarly, the trench 124 may have lateral dimensions ranging from several micrometers to approximately 100 nm and less, depending on the overall device configuration. Furthermore, the conductive barrier material 122 may be formed within the trench 124 and the via 125 with a specific average thickness 122D, which may correspond to a desired target value for the central region 104. For example, the thickness 122D may correspond to a target value of 30 nm and less, as previously explained. Similarly, a thickness of the conductive barrier layer 122 in the bevel region 103 may be significantly less, as previously explained, while at the bevel 105 an even further reduced thickness may be obtained. The conductive barrier layer 122 may be formed in accordance with the techniques described above, i.e., the layer 122 may be provided in the form of at least one deposition/etch cycle, wherein, in other illustrative embodiments, at least two deposition/etch cycles may be used, thereby enabling a reduced overall thickness 122D, which may therefore provide an increased amount of metal, such as copper, which may subsequently be filled into the trench 124 and the via opening 125.

As a result, the present disclosure provides techniques for forming a conductive barrier material with enhanced uniformity, while additionally reducing the amount of the conductive barrier material in the bevel region, thereby reducing the probability of creating contaminants in the form of material delaminations and the like. To this end, a deposition/etch cycle may be used and in illustrative embodiments two or more deposition/etch cycles may be employed to enhance overall uniformity in the central region, while increasingly reducing the amount of material in the bevel region during the sequence of deposition/etch cycles.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   selecting a first target value and a second target value for a thickness of a conductive barrier layer to be formed on a substrate, said substrate having a bevel region and a central region including a plurality of die regions, said first target value being less than said second target value and corresponding to said bevel region, said second target value corresponding to said central region; and
   performing a process sequence comprising at least two deposition/etch cycles for depositing material of said conductive barrier layer above said substrate and subsequently removing material of said conductive barrier layer so as to adjust a thickness of said conductive barrier layer at or below said first and second target values, wherein each successive deposition/etch cycle increases a thickness of said conductive barrier layer above said central region and decreases a thickness of said conductive barrier layer above said bevel region.

2. The method of claim 1, wherein performing said process sequence comprises depositing said conductive barrier layer by physical vapor deposition and removing material of said conductive barrier layer by a sputter etch process.

3. The method of claim 1, further comprising forming a copper-containing metal above said conductive barrier layer.

4. The method of claim 1, wherein said first target value is selected to be approximately 25 nm or less and said second target value is selected to be approximately 30 nm or less.

5. The method of claim 4, wherein said first target value is selected to be approximately 16 nm or less and said second target value is selected to be approximately 22 nm or less.

6. The method of claim 1, wherein said conductive barrier layer comprises tantalum.

7. The method of claim 1, wherein performing said process sequence comprises performing a first deposition/etch cycle to form a first sub-layer of said conductive barrier layer and performing a second deposition/etch cycle to form a second sub-layer of said conductive barrier layer.

8. The method of claim 7, further comprising performing at least one further deposition/etch cycle to form said first sub-layer.

9. The method of claim 7, further comprising performing at least one further deposition/etch cycle to form said second sub-layer.

10. A method, comprising:
    forming a dielectric layer stack for a metallization layer of a semiconductor device above a substrate, said substrate having a central region adjacent to a bevel region; and
    performing a plurality of deposition/etch cycles to form a conductive barrier layer above said dielectric layer stack, wherein each successive deposition/etch cycle of said plurality of deposition/etch cycles increases a thickness of said conductive barrier layer above said central region and decreases a thickness of said conductive barrier layer above said bevel region.

11. The method of claim 10, wherein performing said plurality of deposition/etch cycles comprises performing at least one first deposition/etch cycle to form a first sub-layer and performing at least one second deposition/etch cycle to form a second sub-layer.

12. The method of claim 11, wherein a thickness of said conductive barrier layer in said bevel region is approximately 25 nm or less.

13. The method of claim 12, wherein a thickness of said conductive barrier layer in said central region is approximately 30 nm or less.

14. The method of claim 10, wherein said plurality of deposition/etch cycles comprise performing a sputter deposition process and a sputter etch process.

15. The method of claim 10, wherein performing said plurality of deposition/etch cycles comprises performing at least three deposition/etch cycles.

16. The method of claim 10, wherein said conductive barrier layer comprises tantalum.

17. The method of claim 16, wherein said conductive barrier layer comprises tantalum nitride.

18. A method of forming a metallization layer of a semiconductor device, comprising:
    depositing a first sub-layer of a conductive barrier material above a patterned dielectric layer and a bevel region of a substrate;
    removing a portion of said first sub-layer, wherein said conductive barrier layer has a first thickness above said patterned dielectric layer and a second thickness above said bevel region after removing said portion of said first sub-layer;
    depositing a second sub-layer of said conductive barrier material on said first sub-layer; and
    removing a portion of said second sub-layer, wherein said conductive barrier layer has a third thickness above said patterned dielectric layer and a fourth thickness above said bevel region after removing said portion of said second sub-layer, and wherein said third thickness is greater than said first thickness and said fourth thickness is less than said second thickness.

19. The method of claim 18, wherein said first and second sub-layers are comprised of different material compositions.

20. The method of claim 18, wherein said first and second sub-layers are comprised of the same material composition.

21. The method of claim 18, wherein said first and second sub-layers comprise tantalum.

22. The method of claim 18, further comprising depositing a third sub-layer.

23. The method of claim 22, further comprising removing a portion of said third sub-layer.

24. The method of claim 22, wherein at least one of the first, second and third sub-layers has a material composition that differs from at least one of the other sub-layers.

25. A method, comprising:
    selecting a first target value and a second target value for a thickness of a conductive barrier layer to be formed on a substrate, said substrate having a bevel region and a central region including a plurality of die regions, said first target value being less than said second target value and corresponding to said bevel region, said second target value corresponding to said central region; and
    performing a process sequence comprising at least two deposition/etch cycles for depositing material of said conductive barrier layer above said substrate and subsequently removing material of said conductive barrier layer so as to adjust a thickness of said conductive barrier layer at or below said first and second target values, wherein each successive deposition/etch cycle decreases a thickness of said conductive barrier layer above each of said central and bevel regions.

* * * * *